US012677525B2

(12) United States Patent
Liao

(10) Patent No.: US 12,677,525 B2
(45) Date of Patent: Jul. 7, 2026

(54) LIGHT EMITTING DEVICE HAVING A COMPENSATION UNIT, DISPLAY SUBSTRATE AND DISPLAY DEVICE

(71) Applicants: Hefei BOE Joint Technology Co., Ltd., Hefei (CN); BOE Technology Group Co., Ltd., Beijing (CN)

(72) Inventor: Chinlung Liao, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 584 days.

(21) Appl. No.: 17/642,810

(22) PCT Filed: Apr. 16, 2021

(86) PCT No.: PCT/CN2021/087757
§ 371 (c)(1),
(2) Date: Mar. 14, 2022

(87) PCT Pub. No.: WO2021/218665
PCT Pub. Date: Nov. 4, 2021

(65) Prior Publication Data
US 2022/0384757 A1     Dec. 1, 2022

(30) Foreign Application Priority Data

Apr. 29, 2020     (CN) .......................... 202010358100.7

(51) Int. Cl.
*H10K 50/125*     (2023.01)
*H10K 59/121*     (2023.01)
*H10K 59/40*     (2023.01)
(52) U.S. Cl.
CPC ....... H10K 50/125 (2023.02); H10K 59/1213 (2023.02); H10K 59/40 (2023.02)

(58) Field of Classification Search
CPC .... H10K 50/125; H10K 50/11; H10K 50/805; H10K 59/1213; H10K 59/40;
(Continued)

(56) References Cited

U.S. PATENT DOCUMENTS

| 8,288,951 B2 | 10/2012 | Storch et al. | |
| 2006/0231842 A1* | 10/2006 | Hirakata | ............... H10K 59/90 257/72 |

(Continued)

FOREIGN PATENT DOCUMENTS

| CN | 104617226 A | 5/2015 |
| CN | 107104128 A | 8/2017 |

(Continued)

OTHER PUBLICATIONS

Office Action dated Mar. 11, 2022 issued in corresponding Chinese Application No. 202010358100.7.

*Primary Examiner* — Wael M Fahmy
*Assistant Examiner* — Tiberiu Dan Onuta
(74) *Attorney, Agent, or Firm* — Nath, Goldberg & Meyer; Joshua B. Goldberg

(57) ABSTRACT

The present disclosure provides a light emitting device, a display substrate and a display device. The light emitting device of the present disclosure includes: a first electrode and a second electrode opposite to each other; a plurality of light-emitting units stacked between the first electrode and the second electrode; and a third electrode between adjacent light-emitting units. The first electrode and the second electrode are both electrically coupled to a first signal terminal, the third electrode is coupled to a second signal terminal, and the first signal terminal is configured to provide a first signal and the second signal terminal is
(Continued)

configured to provide a second signal such that only part of the plurality of light-emitting units emits light at a same time.

8 Claims, 3 Drawing Sheets

(58) Field of Classification Search
CPC .. H10K 59/351; H10K 59/32; H10K 2101/10;
G09G 3/3225
See application file for complete search history.

(56) References Cited

U.S. PATENT DOCUMENTS

| | | | | |
|---|---|---|---|---|
| 2008/0117231 | A1* | 5/2008 | Kimpe | ..................... G09G 3/20 |
| | | | | 345/629 |
| 2011/0248244 | A1 | 10/2011 | Ali et al. | |

| | | | | |
|---|---|---|---|---|
| 2015/0253476 | A1* | 9/2015 | Shao | ....................... G02B 5/201 |
| | | | | 359/891 |
| 2015/0339967 | A1* | 11/2015 | Shin | ..................... G09G 3/2003 |
| | | | | 345/690 |
| 2018/0331162 | A1* | 11/2018 | Wu | ......................... H10K 59/32 |
| 2019/0157597 | A1* | 5/2019 | Liao | ..................... H10K 50/156 |

FOREIGN PATENT DOCUMENTS

| | | | | | |
|---|---|---|---|---|---|
| CN | 107170779 | A | | 9/2017 | |
| CN | 107958962 | A | * | 4/2018 | ............. H10K 50/13 |
| CN | 108054286 | A | | 5/2018 | |
| CN | 109192753 | A | | 1/2019 | |
| CN | 110289295 | A | | 9/2019 | |
| CN | 110931534 | A | | 3/2020 | |
| CN | 111525045 | A | | 8/2020 | |
| KR | 20090039139 | A | * | 4/2009 | ........... G09G 3/3225 |
| KR | 20150049923 | A | | 5/2015 | |

* cited by examiner

LIGHT EMITTING DEVICE HAVING A COMPENSATION UNIT, DISPLAY SUBSTRATE AND DISPLAY DEVICE

CROSS-REFERENCE TO RELATED APPLICATION

This is a National Phase Application filed under 35 U.S.C. 371 as a national stage of PCT/CN2021/087757, filed Apr. 16, 2021, an application claiming the benefit from the Chinese patent Application No. 202010358100.7, filed Apr. 29, 2020 the content of each of which is hereby incorporated by reference in its entirety.

TECHNICAL FIELD

The present disclosure belongs to the field of display technology, and particularly relates to a a light emitting device, a display substrate and a display device.

BACKGROUND

Organic light-emitting diode (OLED) displays have been widely used in the display field due to their advantages of high brightness and high reliability. An existing OLED display substrate generally includes a plurality of red light emitting devices R, green light emitting devices G, and blue light emitting devices B that are periodically arranged. A light-emitting drive module provides a driving signal to each light emitting device to light up the light emitting device, thereby realizing colorful display of the entire screen.

SUMMARY

The present disclosure provides a light emitting device, a display substrate and a display device.

The light emitting device according to the present disclosure includes: a first electrode and a second electrode opposite to each other; a plurality of light-emitting units stacked between the first electrode and the second electrode; and a third electrode between adjacent light-emitting units. The first electrode and the second electrode are both coupled to a first signal terminal, the third electrode is coupled to a second signal terminal, the first signal terminal is configured to provide a first signal and the second signal terminal is configured to provide a second signal, so that only part of the plurality of light-emitting units emits light at a same time.

In an embodiment of the present disclosure, the plurality of light-emitting units emit light of a same color.

In an embodiment of the present disclosure, light emitted by a part of the plurality of light-emitting units is monochromatic light, and light emitted by the other part of the plurality of light-emitting units is polychromatic light including the monochromatic light.

In an embodiment of the present disclosure, the polychromatic light is white light.

The display substrate according to the present disclosure includes a plurality of light emitting devices, and at least part of the plurality of light emitting devices is the light emitting device described above.

In an embodiment of the present disclosure, the at least part of the plurality of light emitting devices includes a first light emitting device, a second light emitting device, and a third light emitting device, the first light emitting device includes a first monochromatic light-emitting unit configured to emit monochromatic light of a first color, the second light emitting device includes a second monochromatic light-emitting unit configured to emit monochromatic light of a second color different from the first color, and the third light emitting device includes a third monochromatic light-emitting unit configured to emit monochromatic light of a third color different from the first color and the second color.

In an embodiment of the present disclosure, the first light emitting device further includes a first polychromatic light-emitting unit configured to emit first polychromatic light, the first polychromatic light including the monochromatic light of the first color; the second light emitting device further includes a second polychromatic light-emitting unit configured to emit second polychromatic light, the second polychromatic light including the monochromatic light of the second color; the third light emitting device further includes a third polychromatic light-emitting unit configured to emit third polychromatic light, the third polychromatic light including the monochromatic light of the third color.

In an embodiment of the present disclosure, the first polychromatic light, the second polychromatic light, and the third polychromatic light are all white light.

In an embodiment of the present disclosure, the first light emitting device includes a plurality of first monochromatic light-emitting units, the second light emitting device includes a plurality of second monochromatic light-emitting units, and the third light emitting device includes a plurality of third monochromatic light-emitting units.

In an embodiment of the present disclosure, the at least part of the plurality of light emitting devices further includes a compensation light emitting device, the compensation light emitting device includes a fourth polychromatic light-emitting unit configured to emit fourth polychromatic light.

In an embodiment of the present disclosure, the compensation light emitting device further includes at least one of the first monochromatic light-emitting unit, the second monochromatic light-emitting unit, and the third monochromatic light-emitting unit.

In an embodiment of the present disclosure, the first monochromatic light-emitting unit is configured to emit red light, the second monochromatic light-emitting unit is configured to emit green light, the third monochromatic light-emitting unit is configured to emit blue light, and the fourth polychromatic light-emitting unit is configured to emit white light.

In an embodiment of the present disclosure, the compensation light emitting device includes the second monochromatic light-emitting unit.

In an embodiment of the present disclosure, the compensation light emitting device includes the third monochromatic light-emitting unit.

In an embodiment of the present disclosure, the display substrate further includes: a color filter layer; the color filter layer is on a light-exiting side of the plurality of light emitting devices.

In an embodiment of the present disclosure, the display substrate further includes: a light-emitting drive circuit. The light-emitting drive circuit is coupled to the first signal terminal and the second signal terminal, and is configured to control the first signal terminal to output the first signal and control the second signal terminal to output the second signal.

The display device according to the present disclosure includes the display substrate as described above.

DETAIL DESCRIPTION OF EMBODIMENTS

In order to enable those skilled in the art to better understand the technical solutions of the present disclosure, the present disclosure will be further described in detail below with reference to the accompanying drawings and specific embodiments.

Figure 1:
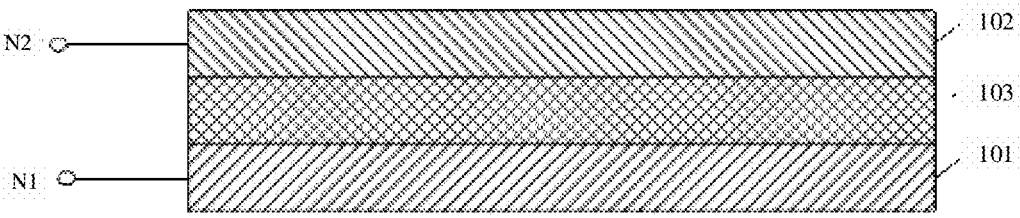
FIG. 1 is a schematic structural diagram of a light emitting device in the related art.

FIG. 1 is a schematic structural diagram of a light emitting device in the related art. As shown in FIG. 1, the light emitting device includes: a first electrode 101 and a second electrode 102 disposed opposite to each other, and a light-emitting layer 103 sandwiched between the first electrode 101 and the second electrode 102. The first electrode 101 may be an anode of the light emitting device, the second electrode 102 may be a cathode of the light emitting device, the first electrode 101 may be coupled to a first signal terminal N1, and the second electrode 102 may be coupled to a second signal terminal N2.

Figure 2:
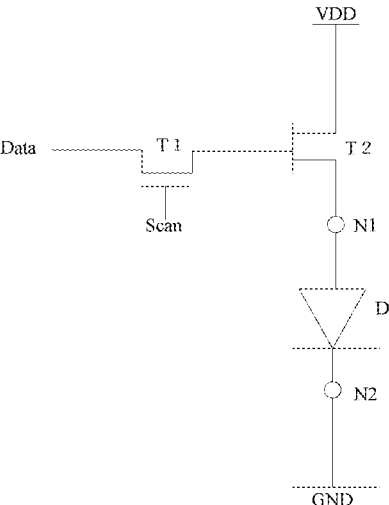
FIG. 2 is a schematic structural diagram of a pixel driving circuit in the related art.

FIG. 2 is a schematic structural diagram of a pixel driving circuit in the related art. As shown in FIG. 2, a gate of a switching transistor T1 is coupled to a scan signal terminal Scan, a source of the switching transistor T1 is coupled to a data signal terminal Data, a drain of the switching transistor T1 is coupled to a gate of a driving transistor T2, a source of the driving transistor T2 is coupled to a first power supply terminal VDD, a drain of the driving transistor T2 is coupled to the first signal terminal N1, the anode of the light emitting device D is coupled to the first signal terminal N1, the cathode of the light emitting device D is coupled to the second signal terminal N2, and the second signal terminal N2 is coupled to a common electrode or a ground terminal GND. During operation of the pixel driving circuit, a data signal provided by the data signal terminal Data may be input to the gate of the driving transistor T2 through the switching transistor T1 to control the driving transistor T2 to be turned on, so that a first power supply voltage from the first power supply terminal VDD is input to the anode of the light emitting device D through the driving transistor T2, and a magnitude of a voltage input to the light emitting device D from the first power supply terminal VDD is controlled by controlling a magnitude of a voltage of the data signal, thereby controlling brightness of the light emitting device D.

However, a luminescent material of each light emitting device of an OLED display substrate will decay over time, which easily affects the service life of the OLED display substrate. Moreover, the luminescent materials of the red light emitting device R, the green light emitting device G, and the blue light emitting device B decay at different rates.

In a case where the luminescent materials of respective light emitting devices decay to different extents, it is easy to cause defects such as nonuniform display of the OLED display substrate.

In view of the above technical problems, the present disclosure provides a light emitting device, a display substrate including the light emitting device, and a display device including the display substrate.

Figure 3:
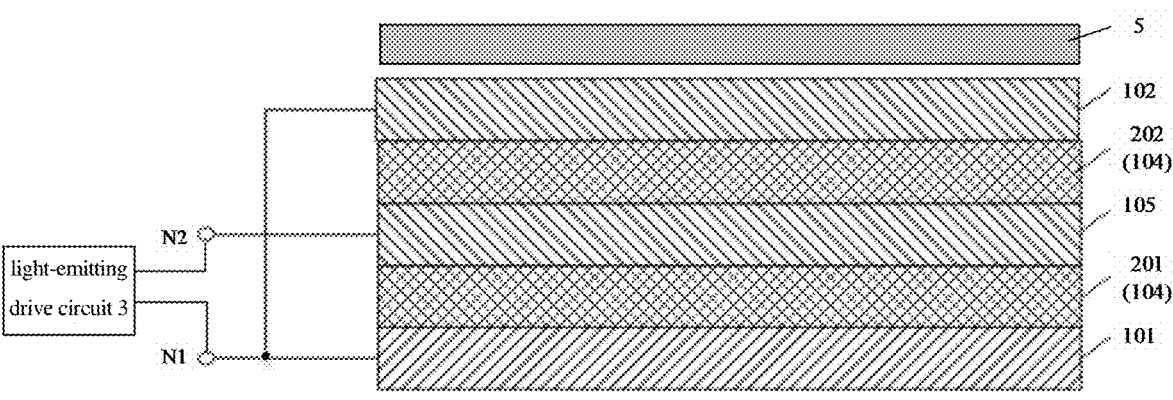
FIG. 3 is a schematic structural diagram of a light emitting device according to an embodiment of the present disclosure.

FIG. 3 is a schematic structural diagram of a light emitting device according to an embodiment of the present disclosure. As shown in FIG. 3, the light emitting device includes: a first electrode 101 and a second electrode 102 disposed opposite to each other, a plurality of light-emitting units 104 stacked between the first electrode 101 and the second electrode 102, and a third electrode 105 disposed between adjacent light-emitting units 104. The first electrode 101 and the second electrode 102 are electrically coupled, and the first electrode 101 and the second electrode 102 are both coupled to a first signal terminal N1, the third electrode 105 is coupled to a second signal terminal N2, the first signal terminal N1 is configured to provide a first signal and the second signal terminal N2 is configured to provide a second signal, so that only part of the plurality of light-emitting units 104 emit light at the same time.

It should be noted that, for ease of description, in the embodiments of the present disclosure, description is given by taking a case where the light emitting device includes two light-emitting units 104 as an example. Among the two light-emitting units 104, the light-emitting unit 104 on a side close to an anode may be a first light-emitting unit 201, and the light-emitting unit 104 on a side close to a cathode may be a second light-emitting unit 202. In the embodiments of the present disclosure, the first electrode 101 of the light emitting device may be the anode, and the second electrode 102 of the light emitting device may be the cathode. Signals provided by the first signal terminal N1 and the second signal terminal N2 may be the same as those provided by the first signal terminal N1 and the second signal terminal N2 in the related art. A pixel driving circuit for the light emitting device in the embodiments of the present disclosure may be the same as the pixel driving circuit in the related art. Different from the related art, the anode and the cathode of the light emitting device in the embodiments of the present disclosure are both coupled to the first signal terminal N1, and the third electrode 105 is coupled to the second signal terminal N2. For the first light-emitting unit 201, the third electrode 105 serves as a cathode; for the second light-emitting unit 202, the third electrode 105 serves as an anode. Signals are input to the first signal terminal N1 and the second signal terminal N2. A potential E1 of the anode is equal to a potential E3 of the cathode. In a case where a potential E2 of the third electrode 105 satisfies the condition that E2<E1=E3, the first light-emitting unit 201 is forward biased, the first light-emitting unit 201 thus emits light, the second light-emitting unit 202 is reverse biased, and thus the second light-emitting unit 202 does not emit light. Similarly, in a case where the potential E2 of the third electrode 105 satisfies the condition that E2>E1=E3, the first light-emitting unit 201 is reverse biased, the first light-emitting unit 201 thus does not emit light, the second light-emitting unit 202 is forward biased, and thus the second light-emitting unit 202 emits light. Thus, the first light-emitting unit 201 can be controlled to emit light by controlling the voltage between the anode and the third electrode 105, and the second light-emitting unit 202 can be controlled to emit light by controlling the voltage between the cathode and the third electrode 105. In addition, light-emitting brightness of the first light-emitting unit 201 and the second light-emitting unit 202 can be controlled through voltage differences between adjacent electrodes. In this way, the first light-emitting unit 201 and the second light-emitting unit 202 can independently emit light. At a same time, only the first light-emitting unit 201 or only the second light-emitting unit 202 emits light; alternatively, the first light-emitting unit 201 and the second light-emitting unit 202 may alternately emit light. Therefore, compared with the light emitting device provided with only one light-emitting layer in the related art, the service life of the light emitting device in the embodiments of the present disclosure can be significantly increased, thereby avoiding the problem of display defects caused by decay of the luminescent material, thereby improving display effect.

In some embodiments, the third electrode 105 may be a charge generation layer, and may be made of metal. In order to ensure light transmittance of the first light-emitting unit 201 under the third electrode 105, the third electrode 105 may be made to have a small thickness to improve the light transmittance of the third electrode 105. In some embodiments, the material of the third electrode 105 may also be a mixture of a metal and a charge transport material, or other material. As an example, the metal in the third electrode 105 may be an alkali metal, such as lithium.

In some embodiments, light emitted by the plurality of light-emitting units 104 have a same color.

It should be noted that light emitted by the first light-emitting unit 201 and the second light-emitting unit 202 that are arranged in a stack manner may have a same color. In an actual application, one of the first light-emitting unit 201 and the second light-emitting unit 202 may be controlled to emit light at one time, or the first light-emitting unit 201 and the second light-emitting unit 202 may be controlled to emit light alternately, so that the service life of the entire light emitting device can be improved.

In some embodiments, light emitted by part of the light-emitting units 104 is monochromatic light, and light emitted by part of the light-emitting units 104 is polychromatic light. For example, the polychromatic light may be white light.

It should be noted that the color of the light emitted by the first light-emitting unit 201 may be different from the color of the light emitted by the second light-emitting unit 202. For example, the color of the light emitted by the first light-emitting unit 201 may be red, and the color of light emitted by the second light-emitting unit 202 may be white. In this case, when red light is needed, a red filter may be disposed on a light-emitting side of the light emitting device to filter out light of other colors from the white light emitted by the second light-emitting unit 202 to generate the red light. Therefore, one of the first light-emitting unit 201 and the second light-emitting unit 202 can be controlled to emit light at one time, or the first light-emitting unit 201 and the second light-emitting unit 202 can be controlled to emit light alternately, so that the service life of the entire light emitting device can be improved.

Figure 4:
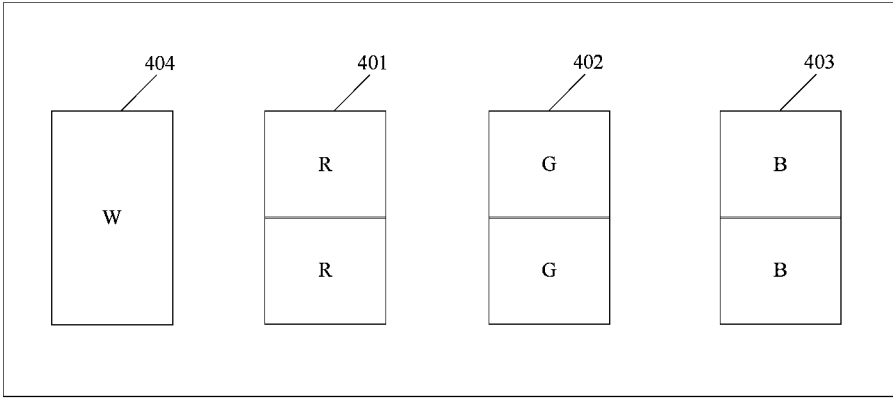
FIG. 4 is a schematic structural diagram of a display substrate according to an embodiment of the present disclosure.

Based on the same inventive concept, embodiments of the present disclosure provide a display substrate, which includes a plurality of light emitting devices in the above embodiments of the present disclosure. FIG. 4 is a schematic structural diagram of a display substrate provided by an embodiment of the present disclosure. As shown in FIG. 4, the display substrate includes a red light emitting device 401, a green light emitting device 402, and a blue light emitting device 403. In an embodiment of the present disclosure, the red light emitting device 401 includes a plurality of red light-emitting units R; the green light emitting device includes a plurality of green light-emitting units G; the blue light emitting device includes a plurality of blue light-emitting units B.

It should be noted that the light emitting device in the display substrate may include light-emitting units of a same color. For example, the red light emitting device 401 may include two red light-emitting units R that are stacked, and the two red light-emitting units R may not emit light at the same time, so that the service life of the red light emitting devices can be increased. The operating principles of the green light emitting device 402 and the blue light emitting device 403 are similar to the operating principle of the red light emitting device 401 described above, and will not be described in detail here. It could be understood that the display substrate also includes signal lines such as scan lines, data lines, and power lines, and other devices such as transistors, capacitors, and resistors in the related art, and may adopt the driving method in the related art to drive the light emitting devices in the display substrate to emit light to realize picture display, which will not be described in detail here.

Figure 5:
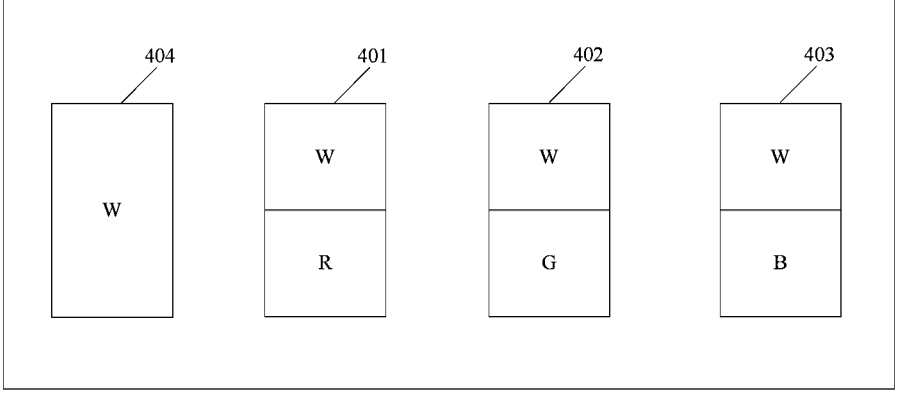
FIG. 5 is a schematic structural diagram of another display substrate according to an embodiment of the present disclosure.

FIG. 5 is a schematic structural diagram of another display substrate according to an embodiment of the present disclosure. As shown in FIG. 5, the display substrate includes a red light emitting device 401, a green light emitting device 402, and a blue light emitting device 403. The red light emitting device 401 includes a red light-emitting unit R and a white light-emitting unit W; the green light emitting device 402 includes a green light-emitting unit G and a white light-emitting unit W; the blue light emitting device 403 includes a blue light-emitting unit B and a white light-emitting unit W.

It should be noted that the light emitting device in the display substrate may include light-emitting units of different colors. For example, the red light emitting device 401 may include the red light-emitting unit R and the white light-emitting unit W. When the red light-emitting unit R is controlled to emit light, the red light emitting device 401 can emit red light. When the white light-emitting unit W is controlled to emit light, the white light-emitting unit W can emit white light, and the white light can turn into red light after passing through a red filter, so that red light is obtained, and the service life of the red light emitting device is improved in the meanwhile. It could be understood that, in FIG. 5, the white light-emitting unit W is located above the red light-emitting unit R, but in practical applications, positions of the red light-emitting unit R and the white light-emitting unit W may be exchanged, for example, the white light-emitting unit W may be located under the red light-emitting unit R. The operating principles of the green light emitting device 402 and the blue light emitting device 403 are similar to the operating principle of the red light emitting device 401 described above, and will not be described in detail here.

As shown in FIGS. 4 and 5, the display substrate further includes a compensation light emitting device, and the compensation light emitting device includes a white compensation light emitting device 404. The white compensation light emitting device 404 includes one white light-emitting unit W or a plurality of white light-emitting units W disposed in a stacked manner.

It should be noted that in practical applications, a blue luminescent material decays the fastest, a green luminescent material comes second, and a red luminescent material decays the slowest. Therefore, it is generally necessary to compensate the brightness of the green light emitting device 402 and the blue light emitting device 403 in the display substrate. For example, in a case where the green light emitting device 402 emits green light having low brightness due to the decay of its luminescent material, a green filter may be adopted to filter white light emitted by the white compensation light emitting device 404 into green light to compensate the brightness of the green light emitting device 402, so that brightness of light emitted by the light emitting devices of respective colors in the display substrate is made uniform, which in turn makes the display picture uniform, and avoids defects such as nonuniform display. It could be understood that the white compensation light emitting device 404 may use only one white light-emitting unit W to emit light, or may use a plurality of white light-emitting units W to emit light, so as to increase the service life of the white light emitting device 404. The operating principle for compensating the brightness of the blue light emitting device 403 is similar to that of the green light emitting device 402 as described above, and will not be described in detail here.

In the related art, when a white picture is presented by the red light emitting devices 401, the green light emitting devices 402, and the blue light emitting devices 403, the total power consumption of the light emitting devices can reach 480 watts. The white compensation light emitting device 404 in the embodiments of the present disclosure can increase the brightness of other light emitting devices during operation. In practical applications, when the white compensation light emitting devices 404 are used to present a white picture together with the red light emitting devices 401, the green light emitting devices 402, and the blue light emitting devices 403, the total power consumption of the light emitting devices can be reduced to 360 watts. Therefore, the white compensation light emitting device 404 in the embodiments of the present disclosure also has an effect of reducing power consumption.

Figure 6:
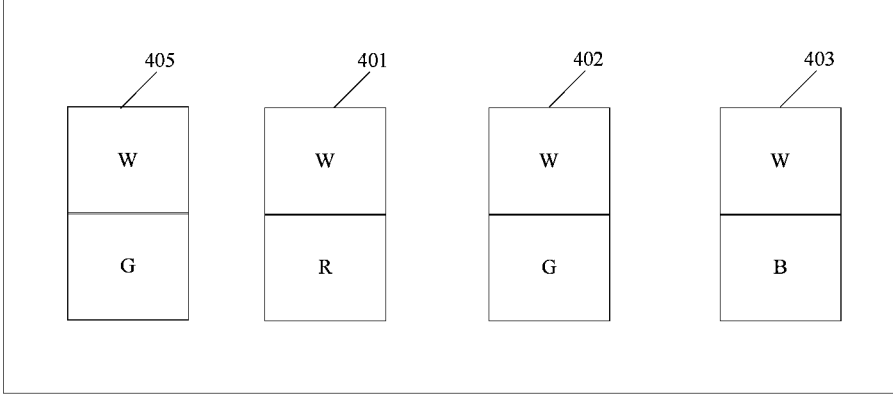
FIG. 6 is a schematic structural diagram of still another display substrate according to an embodiment of the present disclosure.

FIG. 6 is a schematic structural diagram of still another display substrate according to an embodiment of the present disclosure. As shown in FIG. 6, the compensation light emitting device includes a green compensation light emitting device 405, and the green compensation light emitting device 405 includes a white light-emitting unit W and a green light-emitting unit G.

It should be noted that in a case where the green light emitting device 402 emits green light having low brightness due to the decay of the luminescent material, the green compensation light emitting device 405 operates, and the white light-emitting unit W in the green compensation light emitting device 405 can emit white light, and the green filter may be adopted to filter the white light into green light to compensate the brightness of the green light emitting device 402. Alternatively, the green light-emitting unit G in the green compensation light emitting device 405 emits green light to compensate the brightness of the green light emitting device 402. In this way, the brightness of the light emitted by the light emitting devices of respective colors in the display substrate is made uniform, thereby making the display picture uniform, and avoiding defects such as nonuniform display.

Figure 7:
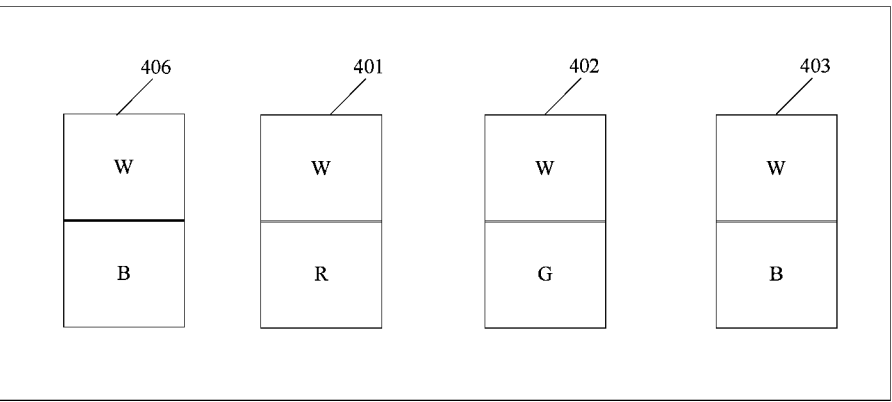
FIG. 7 is a schematic structural diagram of still yet another display substrate according to an embodiment of the present disclosure.

FIG. 7 is a schematic structural diagram of still another display substrate according to an embodiment of the present disclosure. As shown in FIG. 7, the compensation light emitting device includes a blue compensation light emitting device 406, and the blue compensation light emitting device 406 includes a white light-emitting unit W and a blue light-emitting unit B.

It should be noted that in a case where the blue light emitting device 403 emits blue light having low brightness due to the decay of its luminescent material, the blue compensation light emitting device 406 operates, and the white light-emitting unit W in the blue compensation light emitting device 406 can emit white light, and the blue filter may be adopted to filter the white light into blue light to compensate the brightness of the blue light emitting device 403. Alternatively, the blue light-emitting unit B in the blue compensation light emitting device 406 emits blue light to compensate the brightness of the blue light emitting device 403. In this way, the brightness of the light emitted by the light emitting devices of respective colors in the display substrate is made uniform, thereby making the display picture uniform, and avoiding defects such as nonuniform display.

In some embodiments, the above red light-emitting unit R includes a hole transport layer, a red light-emitting layer, an electron transport layer, and an electron injection layer. A voltage signal may be applied between the cathode and the anode, so that hole-electron pairs are formed in the red light-emitting layer to excite the luminescent material to emit light, thereby generating red light. The structures of the green light-emitting unit G and the blue light-emitting unit B are basically the same as the structure of the red light-emitting unit R described above, except that the light-emitting layer in the green light-emitting unit G is a green light-emitting layer, the light-emitting layer in the blue light-emitting unit B is a blue light-emitting layer, and the luminescent materials in the light-emitting layers of different colors have different characteristics, thereby generating light of different colors. The structure of the white light-emitting unit W is basically the same as the structure of the red light-emitting unit R described above, except that the light-emitting layer in the white light-emitting unit W includes a red light-emitting layer R, a green light-emitting layer G, and a blue light-emitting layer B, and under the action of a voltage, the three light-emitting layers of different colors all emit light at the same time, and the emitted light of three different colors is mixed to generate white light.

It should be further noted that the light-emitting layers in each light emitting device may be formed by evaporation or printing. In a same light emitting device, the light-emitting layers in different light-emitting units may be formed by a same process, or may be formed by different processes. For example, in the blue compensation light emitting device 406, the white light-emitting layer may be formed by an evaporation process, and the blue light-emitting layer may be formed by a printing process; alternatively, both the white light-emitting layer and the blue light-emitting layer may be formed by an evaporation process. It could be understood that other film layers in each light emitting device may be formed by using processes in the related art, which will not be described in detail here.

In some embodiments, the display substrate further includes: a color filter layer 5 on a light-exiting side of the light emitting device.

It should be noted that the color filter layer may be located on the light-exiting side of each light emitting device. In a case where the white light-emitting unit in the light emitting device emits white light, the white light can be filtered into monochromatic light of a required color as actually needed, so that the service life of the light emitting device is increased, the brightness of the light emitting device is compensated, and then light emitted by the light emitting device of each color has uniform brightness.

In some embodiments, the display substrate further includes: a light-emitting drive circuit 3; the light-emitting drive circuit 3 is coupled to the first signal terminal N1 and the second signal terminal N2, and is configured to control the first signal terminal N1 and the second signal terminal N2 to output corresponding signals.

It should be noted that the light-emitting drive circuit may provide voltage signals to the first signal terminal N1 and the second signal terminal N2 such that the voltages of the first signal terminal N1 and the voltage of the second signal terminal N2 are different, as a result, different light-emitting units are driven to emit light, and only a part of the light-emitting units emits light at the same time, so as to increase the service life of the light emitting device.

Based on the same inventive concept, embodiments of the present disclosure provide a display device, which includes the display substrate in the above embodiments of the present disclosure. The display device according to the present disclosure may include a terminal device such as a mobile phone, a tablet computer, a smart TV, or the like, its implementation principle is similar to that of the display substrate in the above embodiments, and will not be repeated here.

It could be understood that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements are also deemed to be within the protection scope of the present disclosure.

What is claimed is:

1. A display substrate, comprising pixel units, at least one of which comprises a first light emitting device, a second light emitting device, a third light emitting device and a compensation light emitting device, wherein each of the first light emitting device, the second light emitting device, the third light emitting device and the compensation light emitting device comprises:

a first electrode and a second electrode opposite to each other;

a plurality of light-emitting units stacked between the first electrode and the second electrode; and a third electrode between adjacent light-emitting units, wherein the first electrode and the second electrode are both coupled to a first signal terminal, the third electrode is coupled to a second signal terminal, and the first signal terminal is configured to provide a first signal and the second signal terminal is configured to provide a second signal, so that only part of the plurality of light-emitting units emits light at a same time, wherein the plurality of light-emitting units of the first light emitting device comprise a first monochromatic light-emitting unit configured to emit red light and a first polychromatic light-emitting unit configured to emit first polychromatic light; the plurality of light-emitting units of the second light emitting device comprise a second monochromatic light-emitting unit configured to emit green light and a second polychromatic light-emitting unit configured to emit second polychromatic light; the plurality of light-emitting units of the third light emitting device comprise a third monochromatic light-emitting unit configured to emit blue light and a third polychromatic light-emitting unit configured to emit third polychromatic light; and the plurality of light-emitting units of the compensation light emitting device comprise a light emitting unit configured to emit green light and a fourth polychromatic light-emitting unit configured to emit white light.

2. The display substrate of claim 1, wherein the first light emitting device comprises a plurality of first monochromatic light-emitting units, the second light emitting device comprises a plurality of second monochromatic light-emitting units, and the third light emitting device comprises a plurality of third monochromatic light-emitting units.

3. The display substrate of claim 1, further comprising: a light-emitting drive circuit, wherein the light-emitting drive circuit is coupled to the first signal terminal and the second signal terminal, and is configured to control the first signal terminal to output the first signal and control the second signal terminal to output the second signal.

4. A display device, comprising the display substrate of claim 1.

5. The display substrate of claim 1, further comprising: a color filter layer;

wherein the color filter layer is on a light-exiting side of the plurality of light emitting devices.

6. The display substrate of claim 1, wherein the first polychromatic light comprises red light;

the second polychromatic light comprises green light; and the third polychromatic light blue light.

7. The display substrate of claim 6, wherein the first polychromatic light, the second polychromatic light, the third polychromatic light, and the fourth polychromatic light are all white light.

8. The display substrate of claim 6, further comprising: a color filter layer;

wherein the color filter layer is on a light-exiting side of the plurality of light emitting devices.

* * * * *